United States Patent
Lee et al.

(10) Patent No.: US 10,014,406 B2
(45) Date of Patent: Jul. 3, 2018

(54) SEMICONDUCTOR DEVICE AND METHOD OF FORMING THE SAME

(71) Applicant: UNITED MICROELECTRONICS CORP., Hsin-Chu (TW)

(72) Inventors: Zhi-Cheng Lee, Tainan (TW); Yu-Hao Huang, Kaohsiung (TW); Kai-Lin Lee, Kinmen County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/238,696

(22) Filed: Aug. 16, 2016

(65) Prior Publication Data

US 2018/0012992 A1 Jan. 11, 2018

(30) Foreign Application Priority Data

Jul. 7, 2016 (CN) .......................... 2016 1 0531514

(51) Int. Cl.
*H01L 29/78* (2006.01)
*H01L 29/66* (2006.01)
*H01L 29/40* (2006.01)
*H01L 29/10* (2006.01)

(52) U.S. Cl.
CPC ...... *H01L 29/7816* (2013.01); *H01L 29/1083* (2013.01); *H01L 29/1095* (2013.01); *H01L 29/402* (2013.01); *H01L 29/66681* (2013.01); *H01L 29/66689* (2013.01); *H01L 29/66795* (2013.01); *H01L 29/7835* (2013.01); *H01L 29/7851* (2013.01)

(58) Field of Classification Search
CPC ............. H01L 29/7816; H01L 29/7835; H01L 29/66681; H01L 29/66795; H01L 29/66689; H01L 29/1083; H01L 29/1095; H01L 29/402
See application file for complete search history.

(56) References Cited

U.S. PATENT DOCUMENTS

| | | | |
|---|---|---|---|
| 8,809,952 B2* | 8/2014 | Landgraf | H01L 21/02107 257/339 |
| 8,994,026 B2 | 3/2015 | Voldman | |
| 9,059,282 B2* | 6/2015 | Hodel | H01L 21/823828 |
| 2008/0197408 A1* | 8/2008 | Disney | H01L 29/0653 257/335 |
| 2013/0161739 A1* | 6/2013 | Tseng | H01L 29/404 257/336 |
| 2015/0206880 A1* | 7/2015 | Campi, Jr. | H01L 29/7816 257/338 |
| 2015/0357462 A1 | 12/2015 | Ponoth | |
| 2016/0181358 A1* | 6/2016 | Zhang | H01L 29/66689 257/339 |

* cited by examiner

*Primary Examiner* — Michael Trinh
(74) *Attorney, Agent, or Firm* — Winston Hsu (57) ABSTRACT

A semiconductor device and a forming method thereof, the semiconductor device includes a first and a second wells, a source region, a drain region, two gate structures and at least one doping region. The first well with a first conductive type is disposed in a substrate, and the source region is disposed in the first well. The second well with a second conductive type is disposed adjacent to the first well in a substrate, and the drain region is disposed in the second well. Two gate structures are disposed on the substrate between the source region and the drain region. At least one doping region with the first conductive type is disposed in the second well between the two gate structures.

16 Claims, 11 Drawing Sheets

SEMICONDUCTOR DEVICE AND METHOD OF FORMING THE SAME

BACKGROUND OF THE INVENTION

1. Field of the Invention

The present invention generally relates to a semiconductor device including a metal-oxide semiconductor (MOS) transistor and a method of forming the same, and more particularly, to a semiconductor device including a lateral diffused metal-oxide semiconductor (LDMOS) transistor and a method of forming the same.

2. Description of the Prior Art

As known in the art, a metal-oxide-semiconductor (MOS) transistor is usually used to be a switch for controlling a current flow when proper voltage bias is applied to it. MOS transistors have been widely used in the semiconductor industry for these advantages such as less power consumption and the capability of forming highly integrated circuits. For those circuits operating under high voltage, such as devices in the input/output terminals of a circuit, a lateral diffused metal-oxide semiconductor (LDMOS) transistor is mostly used for being able to sustain high voltage so as to prevent the core devices from breaking down electrically caused by the high voltage which the core devices cannot bearing. With the progress of the semiconductor industry, the integrated circuit has been more delicate and had increased complexity. Therefore, it is an important task in the technical field of forming an integrated circuit to obtain a LDMOS transistor with precisely controlled structure through a well-controlled process.

SUMMARY OF THE INVENTION

The present invention provides a semiconductor device and a method of forming the same. According to the present invention, a doping region is additionally disposed between the gate electrode and the drain region of a LDMOS transistor of a semiconductor device, wherein the conductive type of the doping region is complementary to that of the LDMOS transistor. The semiconductor device according to the present invention may be able to sustain higher voltages and achieve better device performance.

One objective of the present invention is to provide a semiconductor device including a first well and a second well, a source region, a drain region, two gate structures and a doping region. The first well has a first conductive type and is disposed in a substrate, wherein the source region is disposed in the first well. The second well has a second conductive type and is disposed in the substrate, adjacent to the first well, wherein the drain region is disposed in the second well. The two gate structures are disposed on the substrate between the source region and the drain region. The doping region has the first conductive type and is disposed in the region of the second well between the two gate structures.

Another objective of the present invention is to provide a method of forming a semiconductor device. The method according to the present invention includes the following steps. First, a substrate is provided. Next, a first well having a first conductive type is formed in the substrate, and a source region is formed in the first well. Subsequently, a second well having a second conductivity type is formed in the substrate and adjacent to the first well, and a drain region is formed in the second well. Afterward, two gate structures are formed on the substrate between the source region and the drain region. Hereafter, at least a doping region having the first conductive type is formed in the second well and between the two gate structures.

One of the features of the present invention is that the LDMOS of the semiconductor device has at least a doping region with the complementary conductive type, or at least a shallow trench isolation surrounded by a doping region with the complementary conductive type, additionally disposed between the gate electrode and the drain region of the LDMOS transistor of the semiconductor device, the channel length of the LDMOS transistor may be lengthened effectively, thereby the internal resistance is increased. As a result of applying the method of forming the additional doping region or the shallow trench isolation as aforesaid, the internal resistance of the LDMOS transistor is effectively increased, and the hot carrier injection (HCI) problem due to the highly overlapping of the electric field and current path is improved effectively as well. Therefore, the LDMOS transistor of the semiconductor device is able to sustain higher voltages and achieve better device performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic cross-sectional views showing steps of forming a semiconductor device according to a first embodiment of the present invention, wherein:

FIG. 7 to FIG. 8 are schematic cross-sectional views showing steps of forming a semiconductor device according to a third embodiment of the present invention, wherein:

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
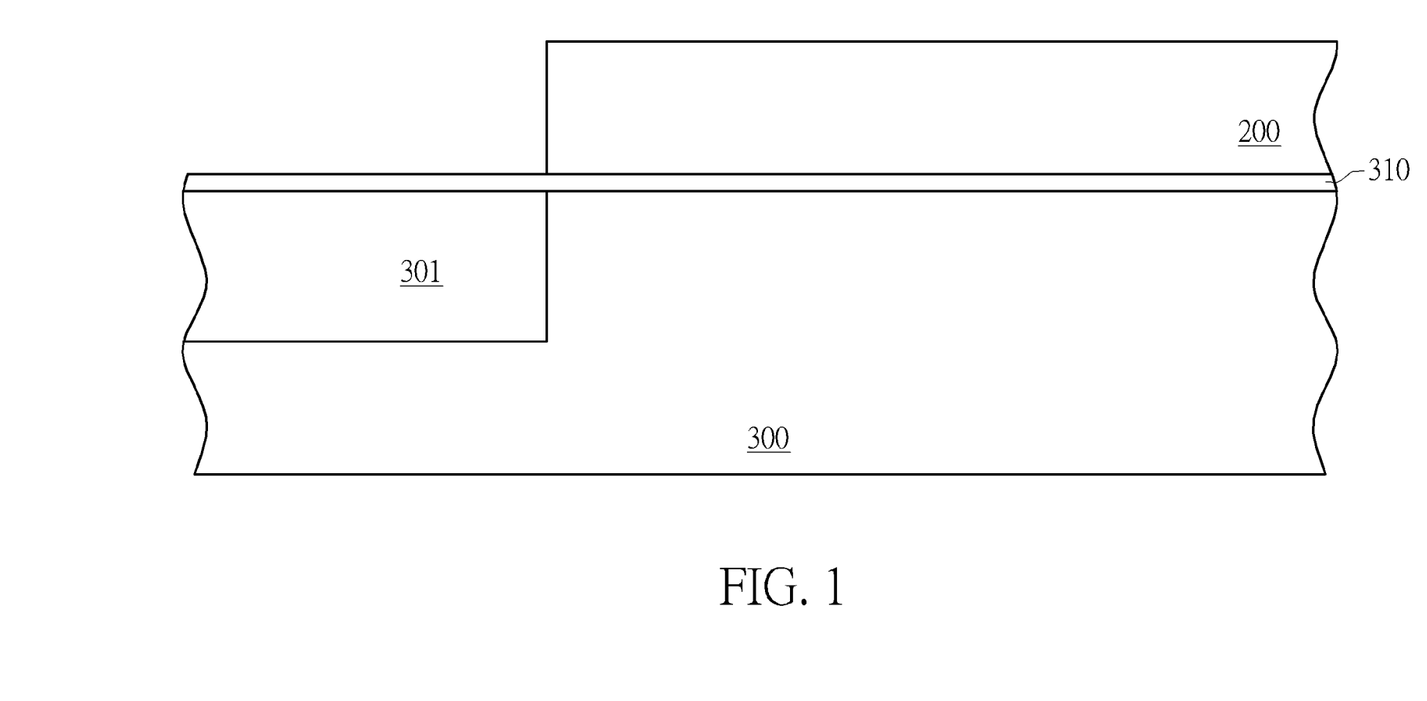
FIG. 1 illustrates a semiconductor device in the beginning of a series of successive steps.

Please refer to FIG. 1 to FIG. 5, which are schematic cross-sectional views showing steps of forming a semiconductor device according to a first embodiment of the present invention. As shown in FIG. 1, a semiconductor substrate 300 is provided. Particularly, the semiconductor substrate 300 may be a silicon substrate, an epitaxial silicon substrate or a silicon on insulator (SOI) substrate, but not limited hereto. According to one embodiment, optionally, at least a shallow trench isolation (STI, not shown) may be formed in the s semiconductor substrate 300 to define different active areas (AA, not shown).

As shown in FIG. 1, a dielectric layer, such as a silicon oxide layer 310, is formed on the substrate 300 to serve as a pad oxide. According to the embodiment, a thermal oxidation process may be carried out to form the silicon oxide layer 310 on the surface of the semiconductor substrate 300. The silicon oxide layer 310 may be used to be a sacrificial oxide during the following ion implantation process, to increase the scattering of the implanted ions so as to avoid the channel effect. However, in another embodiment of the present invention, ion implantation process may be performed directed on the semiconductor substrate 300 without forming the dielectric layer, or a portion of a mask layer (not shown) used to form the shallow trench isolation may be used to be the dielectric layer.

Subsequently, a first well 301 and a second well 302 are formed successively in the semiconductor substrate 300 and are adjacent to each other. According to one embodiment, for example, the first well 301 is formed by the following process. First, a photo resistant layer 200 is formed on the surface of the semiconductor substrate 300 and a predetermined region of the first well 301 is defined in the photo resistant layer 200 after a photolithography process. After that, as shown in FIG. 1, a first ion implantation process is performed to form the first well 301 in the semiconductor substrate 300 by using the photo resistant layer 200 as a mask. According to the embodiment, for example, the semiconductor substrate 300 may be a P type silicon substrate, and preferably, the dopants in the first well 301 have a P-type conductivity, the same as that of the semiconductor substrate 300, but not limited hereto.

Figure 2:
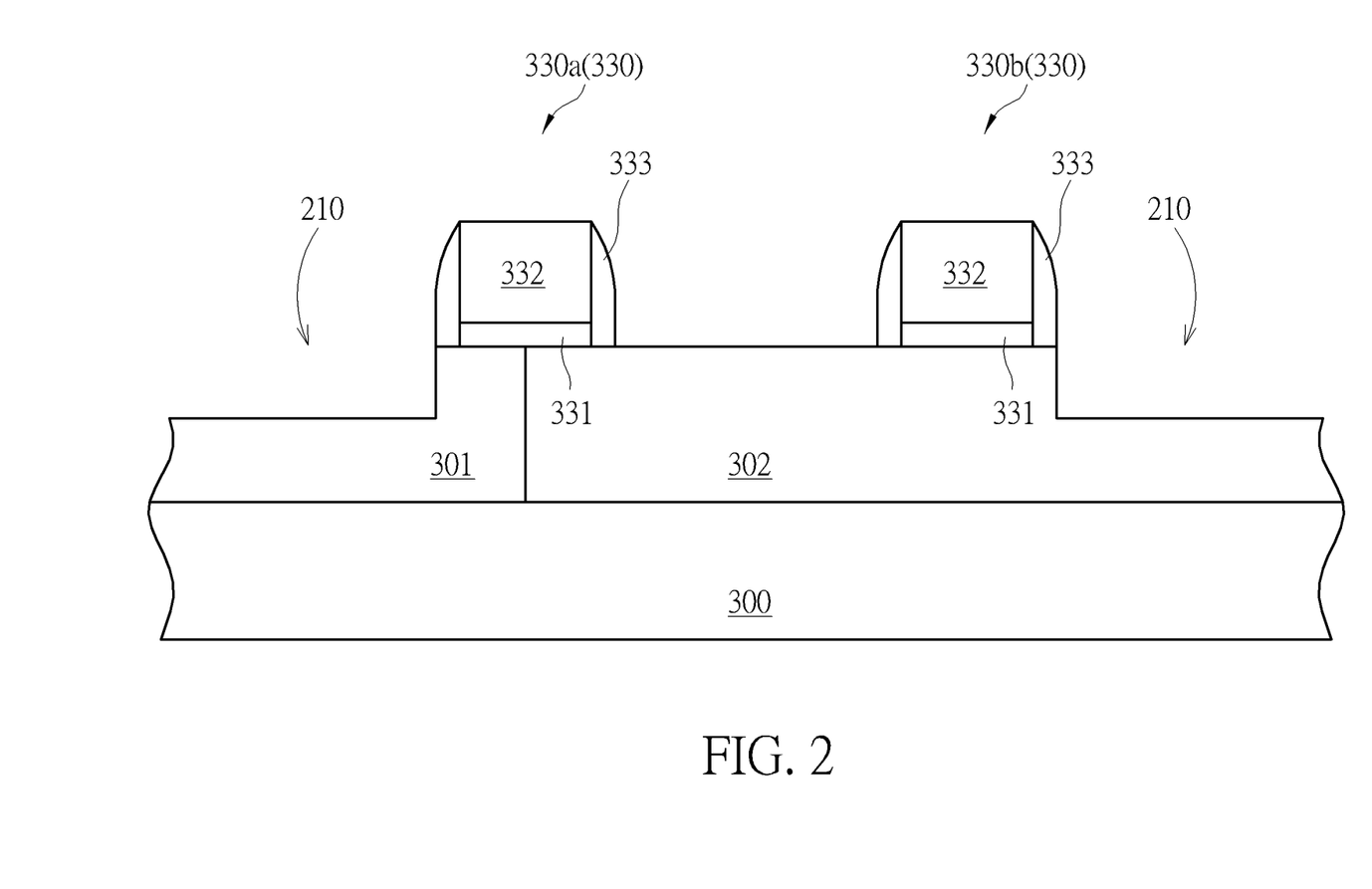
FIG. 2 illustrates a semiconductor device after forming a trench.

Next, the photo resistant layer 200 is removed and a second well 302 is formed in the semiconductor substrate 300. According to one embodiment, the second well 302 may be formed through a similar process of the first well 301. For example, another photo resistant layer (not shown) is formed on the surface of the semiconductor substrate 300, and another photolithography process is performed to define a pre-determined region of the second well 302 in the photo resistant layer. After that, a second ion implantation process is performed using the photo resistant layer 200 as a mask to form the second well 302 in the semiconductor substrate 300 and which is adjacent to the first well 301, as shown in FIG. 2. Preferably, the second well 302 has N type conductivity which is complementary to that of the first well 301, but not limited hereto. After that, the photo resistant layer and the silicon oxide 310 are removed.

Subsequently, at least a gate structure 330 is formed on the semiconductor substrate 300. The gate structure 330 includes a gate dielectric layer 331, a gate electrode 332 and a spacer 333. The gate dielectric layer 331 may include silicon oxide or silicon nitride. The gate electrode 332 may include undoped polysilicon material, doped polysilicon material, amorphous silicon or metal materials. The spacer 333 may have a single layer structure as shown in FIG. 2, or a multi-layer structure (not shown), and may include high temperature oxide (HTO), silicon nitride, silicon oxide, silicon oxynitride, or a HCD-SiN formed from using hexachlorodisilane ($Si_2Cl_6$), but not limited hereto.

According to one embodiment, the gate structure 330 may be formed by the following steps. A gate dielectric layer (not shown) and a gate electrode material layer (not shown) are formed successively and stacking on the semiconductor substrate 300, and are patterned to obtain a stacking structure. After that, a lightly-doped source/drain region (not shown) is formed in the areas of the semiconductor substrate 300 adjacent to the two sides of the stacking structure. Lastly, the spacer 333 is formed on the sidewall of the stacking structure and the gate structure 330 is obtained therefrom. However, in another embodiment, the silicon oxide layer 310 may not be removed and the gate material layer is formed directly on the silicon oxide layer 310. The silicon oxide layer 310 and the gate electrode material layer are patterned at the same time, wherein the patterned silicon oxide layer 310 (not shown) is used to be the gate dielectric layer of the gate structure 330. It should be noticed that according to the present embodiment, two gate structures 330 are formed, wherein the gate structure 330a is disposed on the boundary between the first well 301 and the second well 302, and the gate structure 330b is formed on the second well 302, as shown in FIG. 2.

After that, a first etching process is performed to form a trench 210 in the semiconductor substrate 300 at the two sides of the gate structures 330a, 330b. Particularly, the first etching process is performed using the gate structures 330a, 330b and a mask layer (not shown) as a protecting mask to prevent the semiconductor substrate 300 between the gate structures 330a and 330b from being etched, therefore the trench 210 may be formed in the semiconductor substrate 300 only in the region at the left side of the gate structure 330a and the region at the right side of the gate structure 330b respectively, as shown in FIG. 2. According to one embodiment, preferably, the depth of the trench 210 is between 500 to 550 angstroms, but not limited hereto.

Optionally, a per-clean step may be performed after forming the trench 210. For example, a cleaning solution such as a diluted hydrofluoric acid (DHF)solution or a SPM solution (mixture of $H_2SO_4/H_2O_2$/DI water) may be used to remove the native oxide or other impurities on the surface of the trench 210. After that, an epitaxial structure 303 is formed in the trench 210 and fills the trench 210, as shown in FIG. 3.

Figure 3:
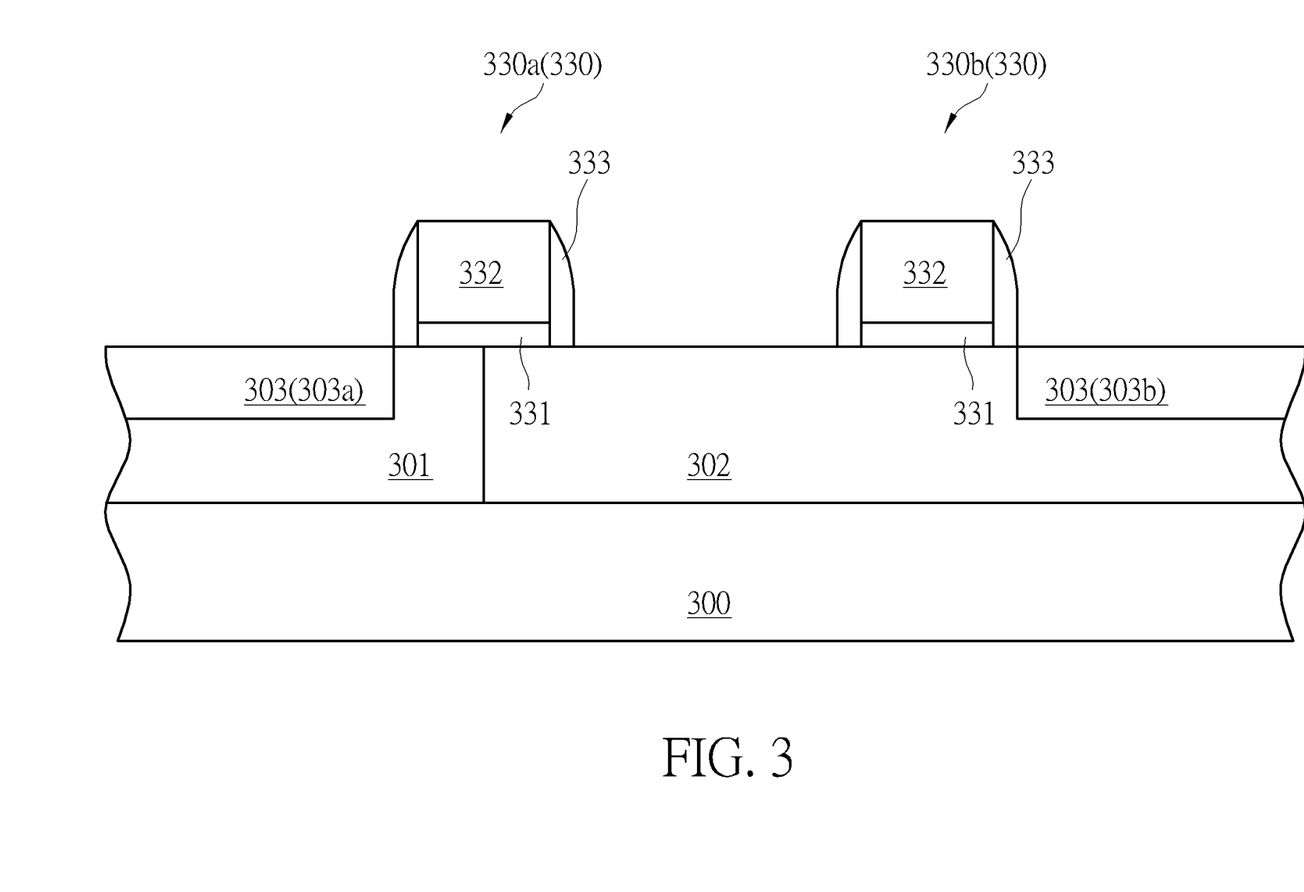
FIG. 3 illustrates a semiconductor device after forming an epitaxial structure.

As shown in FIG. 3, the epitaxial structure 303 may have a surface flush with the top surface of the semiconductor substrate 300, or higher than the top surface of the semiconductor substrate 300 (not shown). The method of forming the epitaxial structure 303 may include, for example, conformally forming a buffer layer (not shown) on the surface of the trench 210. Subsequently, a selective epitaxial growth process is performed to form the epitaxial structure 303 on the buffer layer and filling the trench 210.

It should be noticed that the buffer layer may include, for example, pure silicon, or silicon comprising dopants in a concentration less than 10%. The epitaxial structure 303 may include different materials according to the types of the LDMOS transistor formed later in the process. For example, according to the embodiment wherein a N-type LDMOS transistor is expected to be formed, the material of the epitaxial structure 303 may be selected from SiC, SiCP, or SiP. Furthermore, the selective epitaxial growth process may be performed in the manner of forming a single layer or forming multi-layers. The hetero atoms, such as carbon atoms, in the epitaxial structure 303 may have a concentration gradient in order to facilitate the following process. However, according to another embodiment wherein a P-type LDMOS transistor is expected to be formed, the material of the epitaxial structure 303 may be selected from SiGe, SiCB, or SiGeSn.

A doping process may be performed to form a source region 303a and a drain region 303b in at least a region of the epitaxial structure 303 at two sides of the gate structure 330a and 330b, wherein the source region 303a and the drain region 303b are substantially formed in the first well 301 and the second well 302 respectively, as shown in FIG. 3. Preferably, the doping process is an in-situ doping process performed at the same time during the epitaxial growth to form the epitaxial structure 303, or an additional ion implantation process performed the epitaxial growth. As shown in FIG. 3, the source region 303a and the drain region 303b are substantially formed in the first well 301 and the second well 302 respectively. The conductivity of the dopants in the source region 303a and the drain region 303b may be N-type, which is the same as second well 302, but the concentration of the dopants in the source region 303a and the drain region 303b is higher than in the second well 302. For example, second well 302 may have a concentration of N-type dopants between $5 \times 10^{12}$ to $5 \times 10^{13}$ ions/cm$^2$, and the source region 303a and the drain region 303b may have a concentration of N-type dopants between $1 \times 10^{15}$ to $5 \times 10^{15}$ ions/cm$^2$, but not limited hereto. Moreover, during the in-situ doping process or the ion implantation process, the gate structure 330a, 330b and the mask layer (not shown) are used to be a mask layer, covering the semiconductor substrate 300 between the gate structure 330a, 330b, therefore the source region 303a and the drain region 303b are formed only in the epitaxial structure 303 at the left side of the gate structure 330a and the right side of the gate structure 330b. After that, the mask layer is removed.

Figure 4:
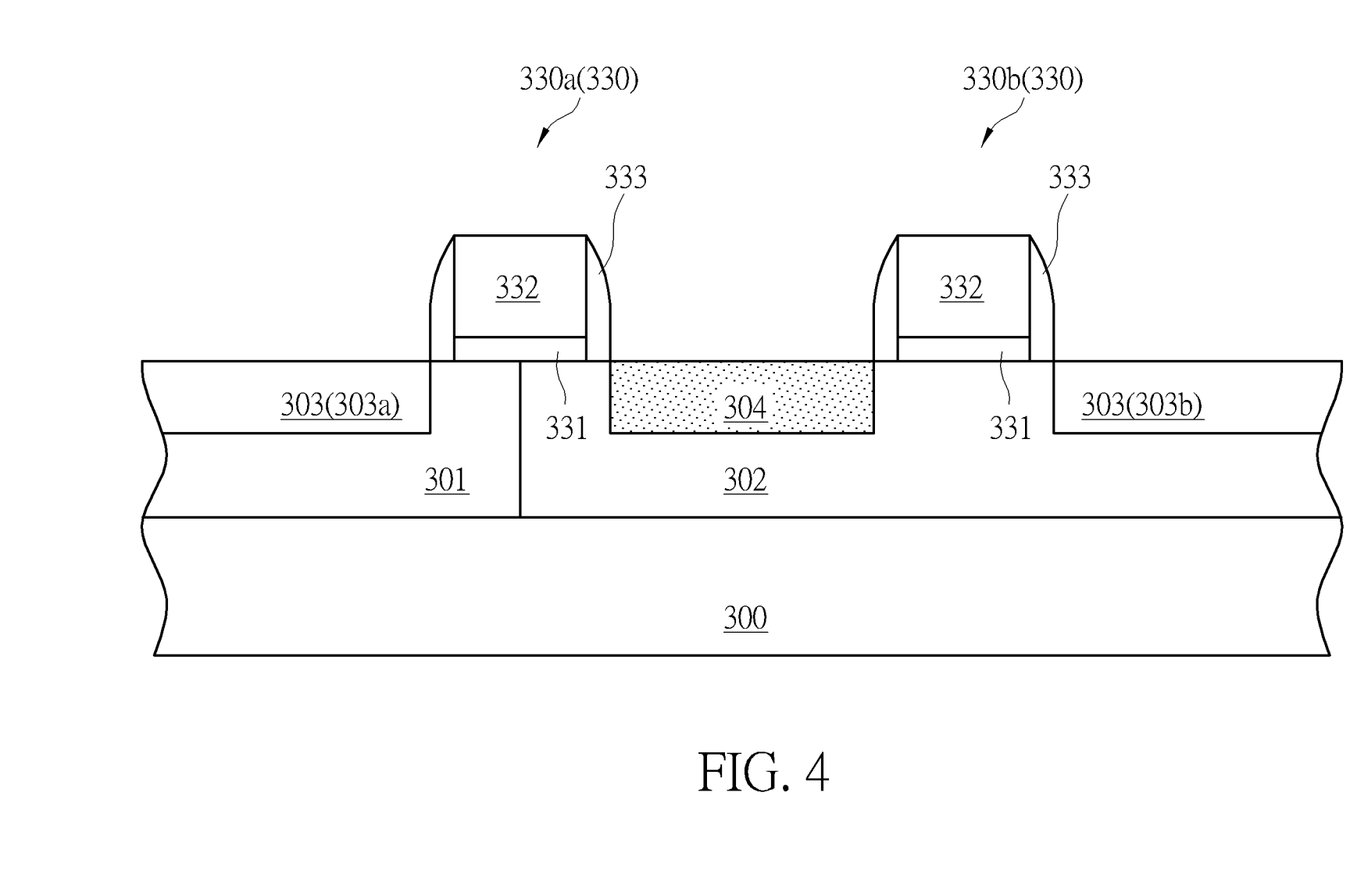
FIG. 4 illustrates a semiconductor device after forming a doping region.

Subsequently, a doping region 304 is additionally formed between the gate structures 330a and 330b, as shown in FIG. 4. According to one embodiment, the process of forming the doping region 304 is similar to that of forming the source region 303a and the drain region 303b illustrated previously. For example, another mask layer is formed and covering the source region 303a at the left side of the gate structure 330a and the drain region 303b at the right side of the gate structure 330b. Afterward, a second etching process is performed to form a trench (not shown) in the semiconductor substrate 300 between the gate structure 330a and 330b. Subsequently, an optional per-clean step may be performed such as using a cleaning solution including a diluted hydrofluoric (DHF) acid solution or a SPM solution (a mixture of $H_2SO_4/H_2O_2/DI$ water) to remove the native oxide or other impurities on the surface of the trench. Hereafter, a buffer layer (not shown) and an epitaxial structure (not shown) filling the trench may be formed successively in the trench. It should be noticed that the buffer layer may include pure silicon or doped silicon with a concentration of dopants less than 10%. The epitaxial structure may be made of a material having a conductive type complementary to that of the LDMOS transistor expected to be formed by the process. For example, according to the embodiment wherein a N-type LDMOS transistor is expected to be formed, the epitaxial structure may include SiGe, but not limited hereto. According to another embodiment wherein a P-type LDMOS transistor is expected to be formed, the epitaxial structure may include SiC or SiP.

Afterward, the doping region 304 is formed in at least a portion of the epitaxial structure. According to the embodiment, an in situ doping process is performed along with the selective epitaxial growth process to form the epitaxial structure and the doping region 304 therein at the same time, as shown in FIG. 4. The doping region 304 may include dopants having a P-type conductivity, which is the same as the conductivity of the first well 301, but the dopant concentration of the doping region 304 is higher than that of the first well. For example, the concentration of the P-type dopants in the first well 301 may be between $5 \times 10^{12}$ to $5 \times 10^{13}$ ions/cm$^2$, and the concentration of the P-type dopants in the doping region 304 may be between $1 \times 10^{15}$ to $5 \times 10^{15}$ ions/cm$^2$, but not limited hereto. Furthermore, according to one embodiment, the selective epitaxial growth process may form a single layer or form multi-layers, and the hetero atoms, such as germanium atoms, included therein may have a concentration gradient in order to facilitate the following process.

Figure 5:
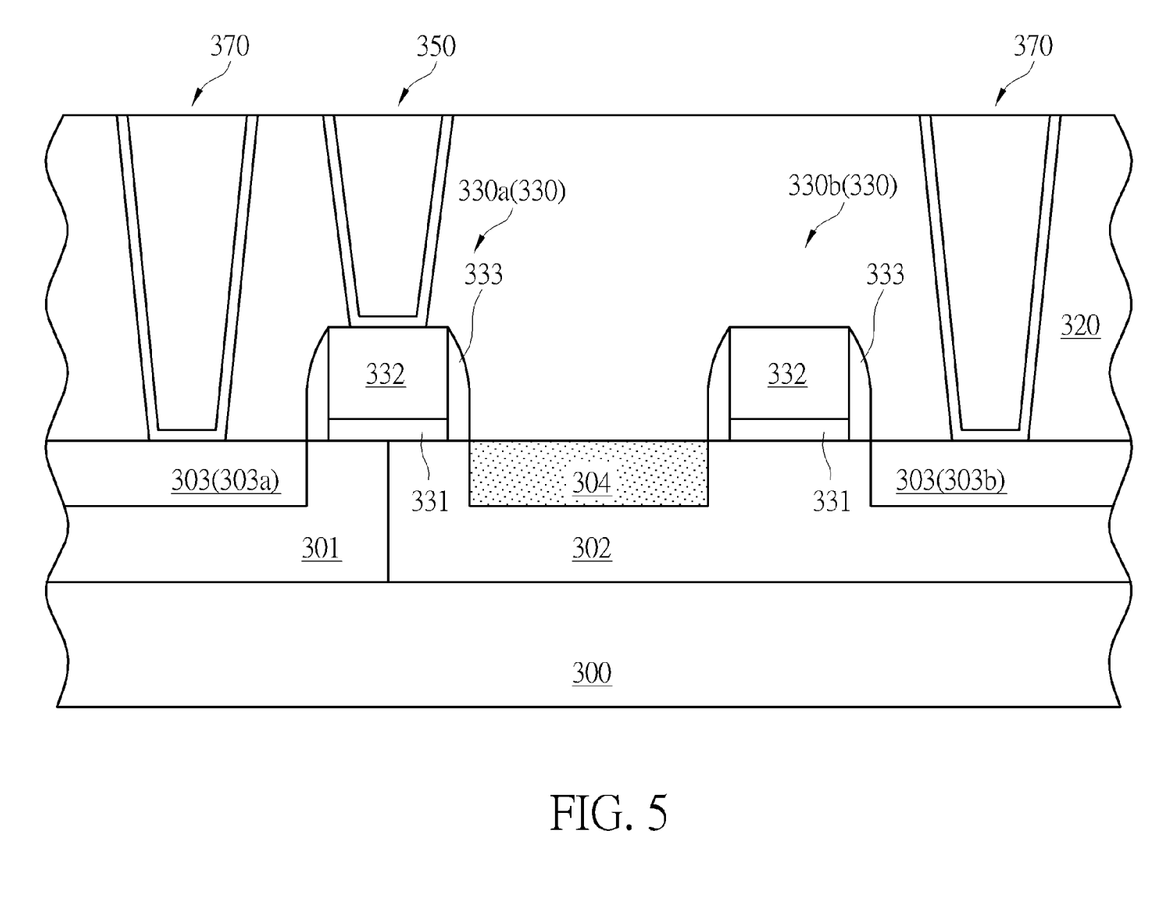
FIG. 5 illustrates a semiconductor device after forming contact plugs.

Subsequently, a strained-Si channel technology may be performed and a contact etching stop layer (CESL, not shown) may be formed on the semiconductor substrate 300. A replacement metal gate process may be performed to replace the gate 332 with a metal gate (not shown). A silicide process may be performed including forming a silicon cap (not shown) covering the top surfaces of the source region 303a and the drain region 303b, and a silicide layer (not shown) is formed on at least a portion of the surfaces of the source region 303a and the drain region 303b. And/or a contact plug process may be performed to form the contact plugs 370 and 350 which electrically connects to the source region 303a, the drain region 303b and the gate structure 330a respectively. The contact plugs 370, 350 are formed in an interlayer dielectric layer 320 upon the semiconductor substrate 300 wherein the interlayer dielectric layer 320 covers the gate structure 330b completely to make the gate structure 330b not connecting to other external input/output terminals and being used as a floating structure or a dummy gate structure. On the other hand, the doping region 304 is also covered by the interlayer dielectric layer 320 completely and used to be a floating region, which is not connecting to other external input/output terminals, such as plugs, either. Therefore, there would not be any silicide layer formed on the surface of the doping region 304.

Accordingly, a semiconductor device according to the first embodiment of the present invention is formed wherein the gate structure 330a, the source region 303a and the drain region 303b may form a N-type LDMOS transistor with the doping region 304 having a conductive type complementary to that of the source region 303a and the drain region 303b formed additionally between the gate electrode 332 of the gate structure 330a and the drain region 303b of the LDMOS transistor. Preferably, the doping region 304 may be made of the epitaxial structure having a conductive type (P-type) complementary to that of the LDMOS transistor and may have a depth between 500 to 550 angstroms. In a typical HV device, the internal resistance of the gate is related to the channel length of the LDMOS. The channel from the source region 303a to the drain region 303b of the LDMOS transistor according to the present embodiment may have a greater length as being influenced by the doping region 304 disposed at one side of the drain region and therefore the internal resistance of the LDMOS transistor is effectively increased. Furthermore, by forming the doping region 304 additionally at a side of the drain region 303b and having a conductive type complementary to that of the LDMOS transistor, the electric field of the LDMOS transistor is pulled away from the surface of the channel and therefore is separated from the path with higher current density. As a result, by applying the method of the present invention, the hot carrier injection (HCI) effect may be reduced by about 50%, and accordingly, the LDMOS transistor may sustain higher voltages and achieve better device performance.

Those of ordinarily skilled in the art should easily understand that the semiconductor device of the present invention may be formed by other methods rather than limited to the aforesaid manufacturing steps. Other embodiments or variations directed to the semiconductor devices and the manufacturing methods will be described in the following paragraphs. To simplify the disclosure, the following description will be focus on and be directed to the different features between the embodiments rather than redundantly repeating similar components. In addition, like reference numerals will refer to like elements throughout the disclosure to facilitate the comparison between embodiments.

Figure 6:
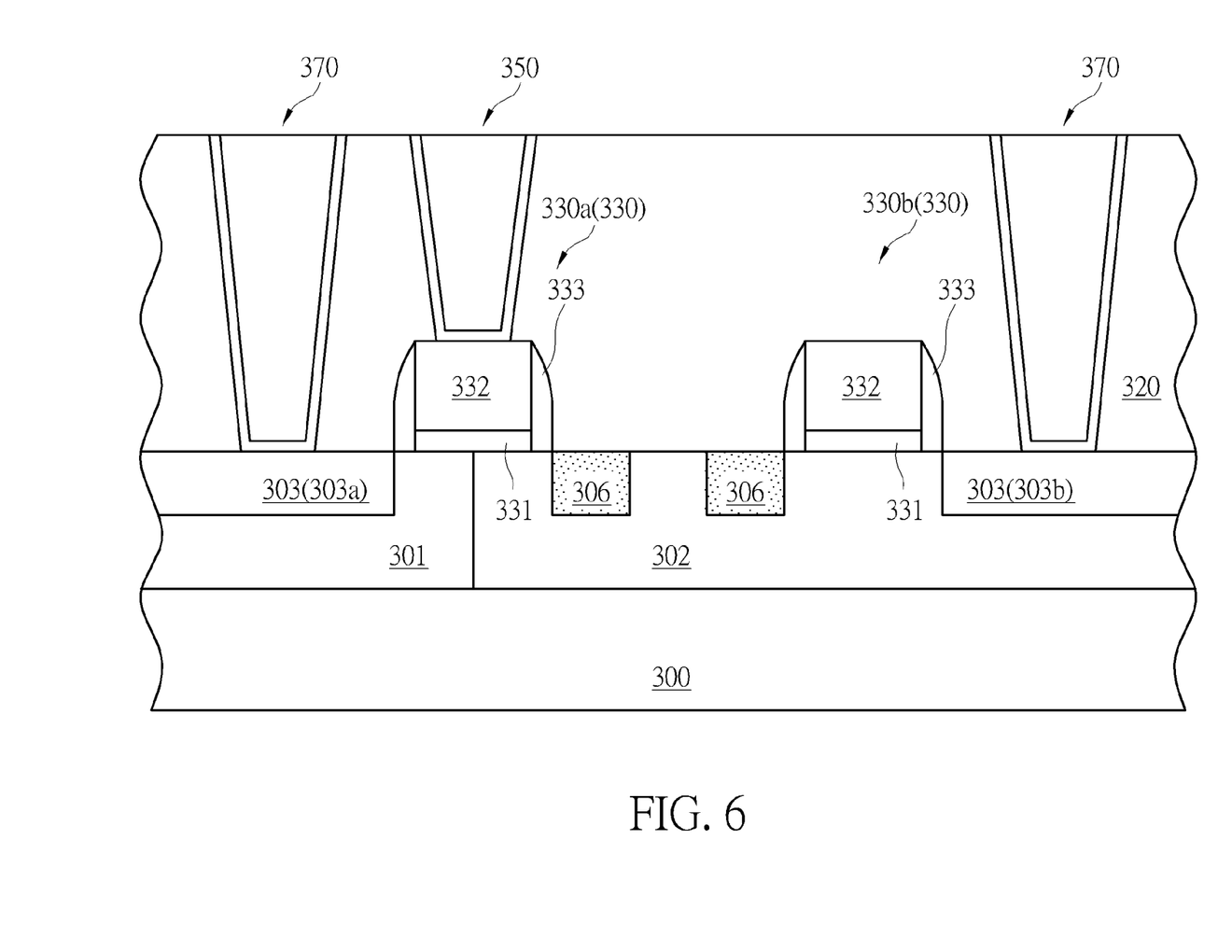
FIG. 6 is a schematic cross-sectional view of a semiconductor device according to a second embodiment of the present invention.

Please refer to FIG. 6, which is a schematic cross-sectional view of a semiconductor device according to a second embodiment of the present invention. The process, chosen materials and features in the second embodiment are similar to those in the first embodiment and will not be narrated herein. The difference is that, in the second embodiment, a plurality of doping regions are formed and separated from each other in the semiconductor substrate 300 between the gate structure 330a and 330b.

According to the second embodiment, two doping regions 306 are formed wherein each one of the doping regions 306 has a sidewall aligning to the spacers 333 of the gate structure 330a or 330b respectively, as shown in FIG. 6. According to the embodiment, the process of forming the doping region 306 and the chosen material and concentration of dopants of the doping regions 306 are similar to that of the doping region 304 in the first embodiment, and will not be narrated herein. It should be understood that the numbers of the doping regions 306 as shown in the second embodiment is for illustration only, and not a limitation for the present invention. The numbers of the doping regions formed between the gate structure 330a and 330b may be adjustable according to different design needs.

According to the second embodiment, the N-type LDMOS transistor of the semiconductor device additionally has a plurality of doping regions 306 additionally disposed between the gate electrode 332 and the drain region 303b and have a conductive type complementary to that of the LDMOS transistor. As a result of the influence of the doping regions 306, the channel of the LDMOS transistor according to the second embodiment may have an increased length and therefore the internal resistance of the LDMOS transistor is effectively increased. Furthermore, by additionally forming a plurality of doping regions 306, the HCI effect may be reduced effectively, too. Therefore, the LDMOS transistor may sustain higher voltages and achieve better device performance.

Figure 7:
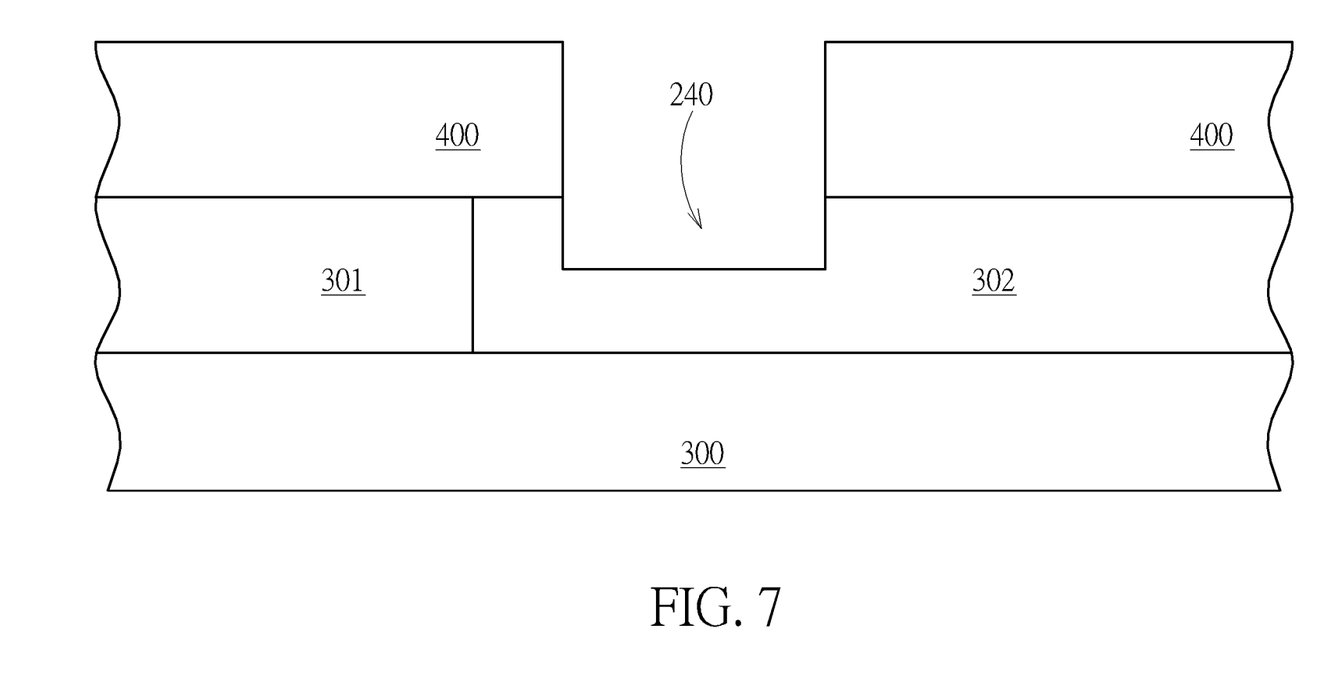
FIG. 7 illustrates a semiconductor device after forming a shallow trench.
Figure 8:
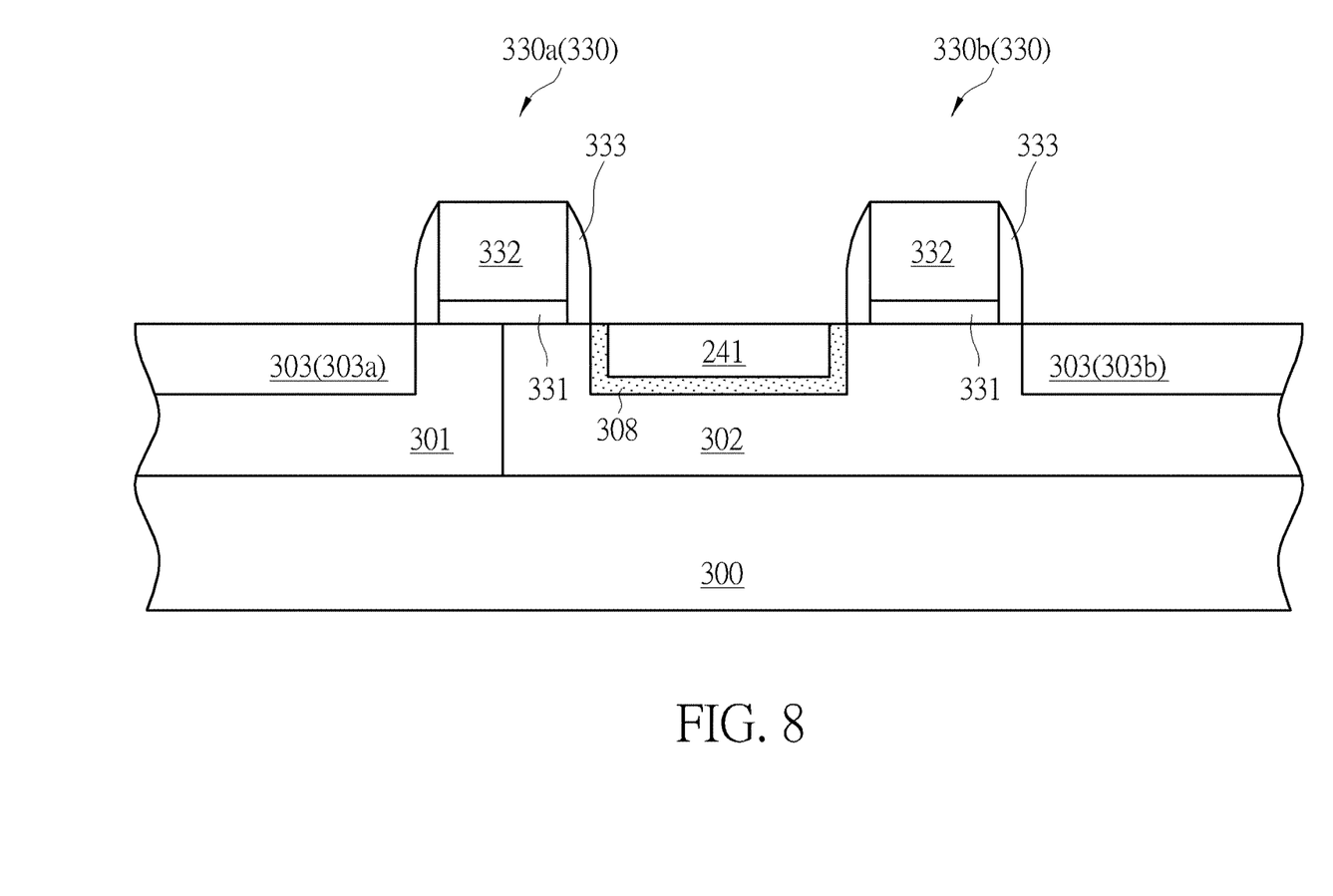
FIG. 8 illustrates a semiconductor device after forming an epitaxial structure.

Please refer to FIG. 7 to FIG. 8, which are schematic cross-sectional views showing steps of forming a semiconductor device according to a third embodiment of the present invention. The process, chosen materials and features in the third embodiment are similar to those in the first embodiment and will not be narrated herein. The difference is that, in the third embodiment, a shallow trench isolation 241 is formed in the semiconductor substrate 300 before forming the gate structure 330a and 330b.

Particularly, after forming the first well 301 and the second well 302 as shown in FIG. 2 of the first embodiment, a photo resistant layer 400 is formed on the surface of the semiconductor substrate 300 directly. A photolithography-etching process (PEP) using the photo resistant layer 400 as a mask is performed to form at least a shallow trench 240 in the semiconductor substrate 300. Preferably, as shown in FIG. 7, the shallow trench 240 is formed in the second well 302.

Subsequently, a doping region 308 is formed on the surface of the shallow trench 240. According to the embodiment, the method of forming the doping region 308 may include performing a selective epitaxial growth process along with an in situ doping process, to form the doping region 308 simultaneously when the epitaxial structure (not shown) is grown, as shown in FIG. 8. Furthermore, the chosen material and concentration of the dopants of the doping regions 308 are similar to that of the doping region 304 in the first embodiment, and will not be narrated herein. Afterward, the photo resistant layer 400 is removed and a dielectric layer is filled into the shallow trench 240 to form the shallow trench isolation 241 in the second well 302, as shown in FIG. 8.

Afterward, similar process as shown in FIG. 2 of the first embodiment may be performed to form the gate structure 330a, 330b, and the source region 303a and drain region 303b at two sides of the gate structure 330a, 3330b, wherein the shallow trench isolation 241 is between the gate structure 330a, 3330b and is surrounded by the doping region 308. Preferably, the two opposite sidewalls of the doping region 308 align to the spacers 333 of the gate structure 330a and 330b respectively, as shown in FIG. 8, but not limited hereto.

Furthermore, a strained silicon technology as illustrated in the first embodiment may be performed and a contact etching stop layer (not shown) may be formed on the semiconductor substrate 300. A replacement metal gate process may be performed to replace the gate 332 with a metal gate (not shown). A silicide process may be performed including forming a silicon cap (not shown) covering the top surfaces of the source region 303a and the drain region 303b, and a silicide layer (not shown) is formed on at least a portion of the surfaces of the source region 303a and the drain region 303b. And/or, a contact plug process may be performed to form the contact plugs (not shown), electrically connecting to the source region 303a, the drain region 303b and the gate structure 330a. The contact plugs are formed in an interlayer dielectric layer (not shown), wherein the interlayer dielectric layer covers the gate structure 330b completely to make the gate structure 330b not connecting to other external input/output terminals and being used as a floating structure or a dummy gate structure. On the other hand, the doping region 308 is also covered by the interlayer dielectric layer and used to be a floating region, which is not connecting to other external input/output terminals, such as plugs, either. Therefore, there would not be any silicide layer formed on the surface of the doping region 308.

According to the third embodiment, the N-type LDMOS transistor of the semiconductor device has a shallow trench isolation 241 additionally disposed between the gate electrode 332 of the gate structure 330a and the drain region 303b wherein the shallow trench isolation 241 is surrounded by a doping region 308 with a conductive type complementary to that of the LDMOS transistor. The channel of the LDMOS transistor may have an increased channel length as a result of the influence form the shallow trench isolation 241, and therefore, the internal resistance of the LDMOS transistor is effectively increased. Furthermore, by additionally forming the shallow trench isolation 241 at one side of the drain region 303b, the HCI effect may be reduced effectively, too. Accordingly, the LDMOS transistor may sustain higher voltages and achieve better device performance.

Figure 9:
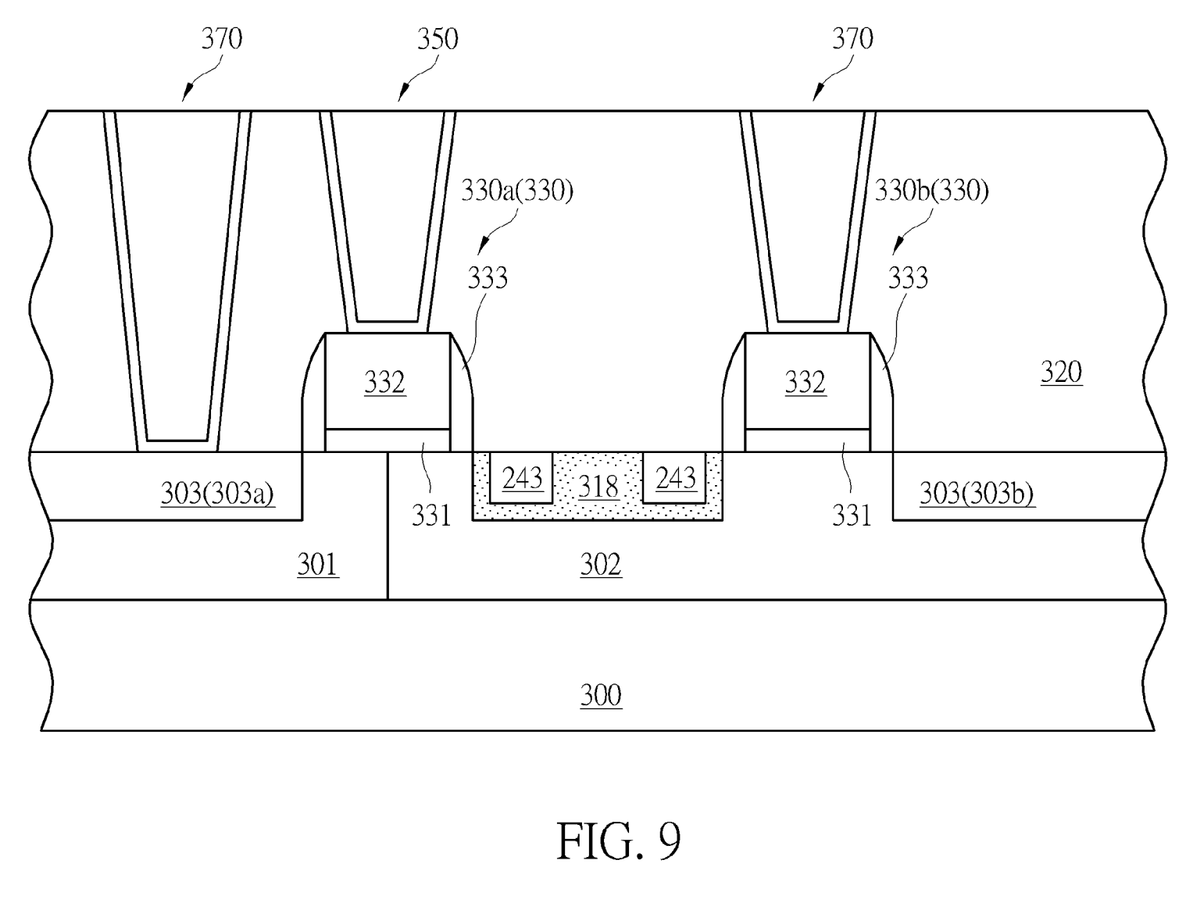
FIG. 9 is schematic cross-sectional view of a semiconductor device according to a fourth embodiment of the present invention.

Please refer to FIG. 9, which is a schematic cross-sectional view of a semiconductor device according to a fourth embodiment of the present invention. The process, chosen materials and features in the third embodiment are similar to those in the third embodiment and will not be narrated herein. The difference is that, in the fourth embodiment, a plurality of shallow trench isolations 243 are formed in the semiconductor substrate 300 between the gate structure 330a and 330b.

According to the fourth embodiment, as shown in FIG. 9, two shallow trench isolations 243 are formed in the semiconductor substrate 300 and are surrounded by the same doping region 318. Preferably, the two opposite sidewalls of the doping region 318 align to the spacers 333 of the gate structures 330a and 330b, but not limited hereto. According to the embodiment, the process of forming the doping region 318 and the chosen material and concentration of the dopants of the doping regions 318 are similar to that of the doping region 308 in the third embodiment, and will not be narrated herein. It should be understood that the numbers of the shallow trench isolation 243 as shown in the fourth embodiment is for illustration only, and not a limitation for the present invention. The numbers of the shallow trench isolation formed between the gate structure 330a and 330b may be adjustable according to different design needs, wherein all of these shallow trenches are surrounded by the same doping region with a conductive type complementary to that of the LDMOS transistor.

According to the fourth embodiment, the N-type LDMOS transistor of the semiconductor device has a plurality of shallow trench isolations 243 additionally disposed between the gate electrode 332 of the gate structure 330a and the drain region 303b, wherein the trench isolations 243 are surrounded by the same doping region 318 (P-type) with a conductive type complementary to that of the LDMOS transistor. The channel of the LDMOS transistor may have an increased channel length as a result of the influences from the shallow trench isolations 243 and the doping regions 318, and therefore, the internal resistance of the LDMOS transistor is effectively increased. Furthermore, by additionally forming the plurality of shallow trench isolations 243 and the doping region 318 at one side of the drain region 303b, the HCI effect may be reduced effectively, too. Accordingly, the LDMOS transistor may sustain higher voltages and achieve better device performance.

Figure 10:
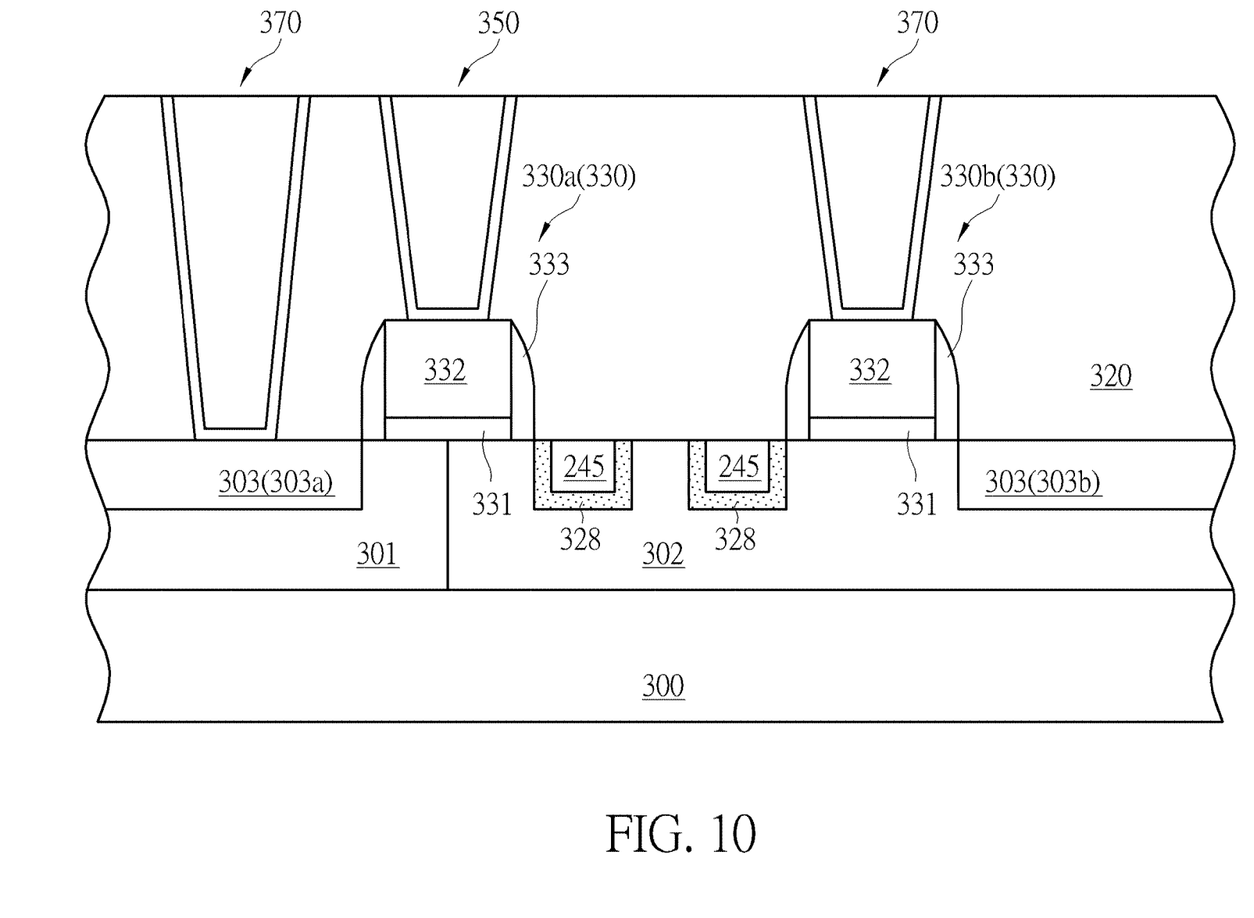
FIG. 10 is schematic cross-sectional view of a semiconductor device according to a fifth embodiment of the present invention.

Please refer to FIG. 10, which is a schematic cross-sectional view of a semiconductor device according to a fifth embodiment of the present invention. The process, chosen materials and features in the fifth embodiment are similar to those in the fourth embodiment, and will not be narrated herein. The difference is that, in the fifth embodiment, a plurality of shallow trench isolations 245 and a plurality of doping regions 328 are formed in the semiconductor substrate 300 between the gate structure 330a and 330b, wherein each of the shallow trench isolations 245 is surrounded by one of the plurality of doping regions 328 respectively.

According to the fifth embodiment, as shown in FIG. 10, two shallow trench isolations 245 are formed in the semiconductor substrate 300, wherein each of them is surrounded by one of the two doping region 328 respectively. A sidewall of each of the two doping regions 328 aligns to a spacer 333 of the gate structure 330a or the gate structure 330b respectively, as shown in FIG. 10. According to the embodiment, the process of forming the shallow trench isolations 245 and doping regions 328, the chosen materials and the concentration of dopants of the doping regions 328 are similar to that of the shallow trench 241 and the doping region 308 in the third embodiment, and will not be narrated herein. It should be understood that the numbers of the doping regions 328 as shown in the fifth embodiment is for illustration only, and not a limitation for the present invention. The numbers of the doping regions formed between the gate structure 330a and 330b may be adjustable according to different design needs, and not restricted to two as shown in FIG. 10.

According to the fifth embodiment of the present invention, the N-type LDMOS transistor of the semiconductor device has a plurality of doping regions 328 and a plurality of shallow trench isolations 245 disposed respectively in each of the doping regions 328 additionally disposed between the gate electrode 332 of the gate structure 330a and the drain region 303b, wherein the doping regions 328 have a conductive type (P-type) complementary to that of the LDMOS transistor. The channel length of the LDMOS transistor may be increased as a result of the influence of the doping regions 328, and therefore, the internal resistance of the LDMOS transistor may be effectively increased. Furthermore, by additionally forming a plurality of doping regions 328 at one side of the drain region 303b, the HCI effect may be reduced effectively, too. Accordingly, the LDMOS transistor may be able to sustain higher voltages and achieve better device performance.

Figure 11:
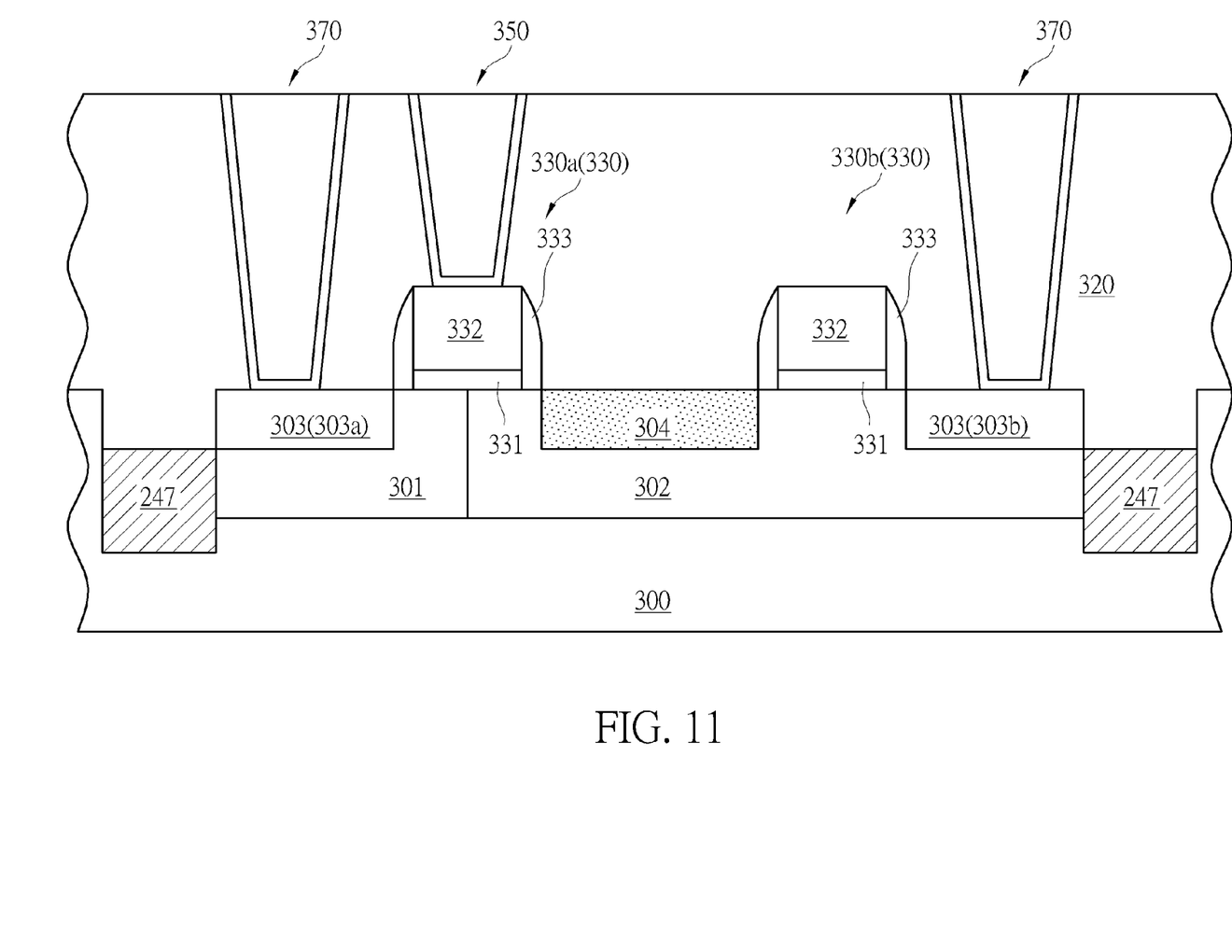
FIG. 11 is a schematic cross-sectional view of a semiconductor device according to a sixth embodiment of the present invention.

Please refer to FIG. 11, which is a schematic cross-sectional view of a semiconductor device according to a sixth embodiment of the present invention. The process, chosen materials and features in the sixth embodiment are similar to those in the first embodiment and will not be narrated herein. The difference is that, in the sixth embodiment, the first well 301, the second well 302 and the gate structure 330 are formed in/on a fin structure 305.

According to the sixth embodiment, as shown in FIG. 11, at least a fin structure 305 is formed protruding from the shallow trench isolation 247, and the source region 303a, the drain region 303b and the gate structure 330 are formed therein or thereon respectively. Afterward, an epitaxial structure is formed in the area of the fin structure 305 between the gate structures 330 to consist the doping region 314. The chosen material and method of forming the doping region 314 and the concentration of the dopants included therein are similar to that of the doping region 304 in the first embodiment, and will not be narrated herein.

According to the sixth embodiment of the present invention, the N-type LDMOS transistor of the semiconductor device is formed on the fin structure 305 with a doping region 314 additionally disposed at one side of the drain region 303b, wherein the doping region 314 has a conductive type (P-type) complementary to that of the LDMOS transistor. Therefore, the HCI effect may also be reduced effectively, and accordingly, the performance of the LDMOS transistor may be improved. Furthermore, it should be noticed that by the method of forming the doping region 314 in the fin structure 305, the fin edge of the fin structure 305 would not be exposed and therefore better device stability is achieved. In other words, the device and the method of forming the device according to the present invention may also be applied to non-planar transistor, such as a fin field-effect-transistor (Fin-FET) as illustrated in the sixth embodiment in addition to planar transistors, such as the LDMOS transistors illustrated in second embodiments to fifth embodiment.

According to the LDMOS of the semiconductor device provided by the present invention, at least a doping region with a conductive type complementary to that of the LDMOS transistor, or at least a shallow trench isolation surrounded by the doping region, is additionally disposed at a side of the drain region. As a result, the channel length of the LDMOS transistor may be increased and an increased internal resistance is obtained accordingly. Preferably, the doping region has an epitaxial structure with a depth between 500 to 550 angstroms. By the way of disposing an additional doping region or an additional shallow trench isolation, the internal resistance of the LDMOS transistor is effectively increased, and the HCI problem due to the highly overlapping of the electric field and current path in conventional device is also improved. Accordingly, the LDMOS transistor in the semiconductor device according to the present invention may be able to sustain higher voltages.

It should be understood that, although the LDMOS transistors in the embodiments illustrated previously are N-type, the present invention may also be applied to form a P-type LDMOS transistor. For example, a N-type silicon substrate (not shown) may be provided with a N-type first well (not shown) and a P-type second well (not shown) formed therein. Subsequently, a P-type LDMOS transistor may be formed on the silicon substrate with a N-type doping region (not shown) additionally disposed at a side of the drain region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first well with a first conductive type disposed in a substrate;
   a source region disposed in the first well;
   a second well with a second conductive type disposed adjacent to the first well in the substrate;
   a drain region disposed in the second well;
   two gate structures disposed on the substrate between the source region and the drain region, wherein the two gate structures, the source region and the drain region together form a MOS device;
   a doping region with the first conductive type disposed in the second well between the two gate structures; and
   a shallow trench, disposed in the second well between the two gate structures, sidewalls and a bottom of the shallow trench being surrounded by the doping region.

2. The semiconductor device according to claim 1, wherein the two gate structures comprise a first gate structure disposed on a border between the first well and the second well.

3. The semiconductor device according to claim 1, wherein the two gate structures comprise a second gate structure disposed on the second well.

4. The semiconductor device according to claim 3, further comprising:
   a dielectric layer covering the second gate structure.

5. The semiconductor device according to claim 1, further comprising another doping region, wherein the doping region and the another doping region dispose separately from each other between the two gate structures.

6. The semiconductor device according to claim 1, further comprising another shallow trench isolation, wherein the another shallow trench isolation is also disposed between the two gate structures and is surrounded by the doping region.

7. The semiconductor device according to claim 5, further comprising another shallow trench isolation, wherein the shallow trench isolation and the another shallow trench isolation disposed separately from each other between the two gate structures and sidewalls and a bottom of the another shallow isolation are surrounded by the another doping region.

8. The semiconductor device according to claim 1, wherein the doping region comprises an epitaxial structure.

9. The semiconductor device according to claim 8, wherein the doping region comprises a top surface flush with the top surface of the substrate.

10. A method of forming a semiconductor device, comprising:
    providing a substrate;
    forming a first well with a first conductive type in the substrate;
    forming a source region in the first well;
    forming a second well with a second conductive type adjacent to the first well in the substrate;
    forming a drain region in the second well;
    forming two gate structures on the substrate between the source region and the drain region, wherein the two gate structures, the source region and the drain region together form a MOS device;
    forming a doping region with the first conductive type in the second well between the two gate structures; and
    forming a shallow trench isolation in the second well between the two gate structures, sidewalls and a bottom of the shallow trench isolation being surrounded by the doped region.

11. The method of forming a semiconductor device according to claim 10, wherein forming the two gate structures comprises:
    forming a first gate structure on a border between the first well and the second well.

12. The method of forming a semiconductor device according to claim 10, wherein forming the two gate structure comprises:
    forming a second gate structure on the second well.

13. The method of forming a semiconductor device according to claim 12, further comprising:
    forming a dielectric layer covering the second gate structure.

14. The method of forming a semiconductor device according to claim 10, further comprising:
    forming another doping region, wherein the doping region and the another doping region dispose separately from each other between the two gate structures.

15. The method of forming a semiconductor device according to claim 10, wherein the shallow trench isolation is formed before the two gate structures.

16. The method of forming a semiconductor device according to claim 10, further comprising:
    forming at least a fin structure on the substrate, wherein the source region, the drain region and the doping region are all formed in the fin structure.

* * * * *